United States Patent [19]

Reynolds

[11] Patent Number: 5,568,145

[45] Date of Patent: Oct. 22, 1996

[54] MOS CURRENT SOURCE LAYOUT TECHNIQUE TO MINIMIZE DEVIATION

[75] Inventor: David C. Reynolds, Georgetown, Mass.

[73] Assignee: Analog Devices, Inc., Norwood, Mass.

[21] Appl. No.: 325,483

[22] Filed: Oct. 19, 1994

[51] Int. Cl.⁶ .................................................. H03M 1/68
[52] U.S. Cl. ............................................................... 341/145
[58] Field of Search .................................. 341/145, 135, 341/144, 148, 150, 154

[56] References Cited

U.S. PATENT DOCUMENTS

| | | | |
|---|---|---|---|
| 4,503,421 | 3/1985 | Hareyama et al. | 341/144 |
| 4,935,740 | 6/1990 | Schouwenhaars et al. | 341/135 |

OTHER PUBLICATIONS

*Matching Properties of MOS Transistors*, Pelgrom et al., IEEE Journal of Solid–State Circuits, vol. 24, No. 5, Oct. 1989 pp. 1433–1439.

Primary Examiner—Brian K. Young
Attorney, Agent, or Firm—Wolf, Greenfield & Sacks, P.C.

[57] ABSTRACT

A current source DAC is provided including a plurality of current source cells arranged in an array of a plurality of columns and rows. Among the plurality of current source cells is a plurality of least significant bit cells, wherein each least significant bit cell includes at least one current source cell. The plurality of least significant bit cells includes current source cells from among a centrally located column of the array. Also among the plurality of current source cells is a plurality of most significant bit cells. Each most significant bit cell includes a plurality of current source cells electrically added together and physically located along a diagonal path across the columns and rows of the array. The current source cell include CMOS transistors. The physical layout and electrical connection scheme reduces DNL errors due to transistor process gradients.

5 Claims, 5 Drawing Sheets

MOS CURRENT SOURCE LAYOUT TECHNIQUE TO MINIMIZE DEVIATION

FIELD OF THE INVENTION

The present invention relates generally to a current source digital-to-analog converter ("DAC") and, more particularly, to a current source DAC having current sources physically arranged and electrically connected in such a way to minimize differential non-linearity ("DNL") errors caused by transistor fabrication gradients.

BACKGROUND OF THE INVENTION

DACs and analog-to-digital converters ("ADCs") have recently come into more widespread use with the development of suitable process technology and the increase in digital audio and video and other applications. One common type of DAC is the so-called "binary-weighted" DAC. Such DACs include a number of taps receiving different binary-weighted currents and a series of switches, connected to those taps, controlled by the input code. Binary-weighted DACs are described, for example, in Analog-Digital Conversion Handbook, Third Edition, by Analog Devices, Inc.

A simple binary-weighted DAC is shown in block diagram form in FIG. 1. As shown, the 3-bit DAC includes three current sources 12, 14 and 16 respectively producing four amps, two amps and one amp. Current source 12 is connected to line 18 and through switch S1 to output line 24. Current source 14 is connected to line 20 and through switch S2 to output line 24. Current source 16 is connected to line 22 and through switch S3 to output line 24. The digital input code is received on bus 26 and controls operation of the switches S1, S2 and S3.

During operation, the input code controls switches S1, S2 and S3 such that during closure of any one of the switches, the current from the corresponding current source will flow through the switch to the output line 24. The switches can be controlled such that they are closed and conduct current when they receive a logical 1. As will be appreciated by those skilled in the art, because of the binary-weighted nature of the current sources, the amount of total current received on output line 24 will be proportional to the input code received. An output buffer stage (not shown), possibly consisting of an operational amplifier, can be connected in series with output line 24 to convert the output current to a voltage and/or to provide amplification, and produce a low-impedance voltage output.

As a result of the operation of the switches, transient glitch energy may be produced causing inaccurate performance. For example, when the input code transitions from binary number 011 to binary number 100, all three switches, S1, S2 and S3 change state despite the fact that the input code has only incremented by binary 1. This action can cause transient glitch energy.

To avoid transient glitch energy problems associated with the switching in binary-weighted DACs, improved prior art DACs use what is referred to as "thermometer code" to control current source cells. An example of such a prior art DAC is shown in FIG. 2. FIG. 2 shows an 8-bit DAC 28 including two 4 to 15 converters 30 and 32. 4 to 15 converter 30 receives the four most significant bits ("MSBs") IN1, IN2, IN3 and IN4 of the digital input code and produces 15 outputs MOUT1–MOUT15. Similairly, 4 to 15 converter 32 receives the four least significant bits ("LSBs") IN5–IN8 of the digital input code and produces outputs LOUT1–LOUT15. The outputs MOUT1–MOUT15 and LOUT1–LOUT15 are referred to as "thermometer code" outputs. As will be appreciated by those skilled in the art, as the digital input code to the 4 to 15 converter is incremented by binary 1, only one of the outputs changes state.

The DAC 28 also includes 15 MSB current source cells MCELL1–MCELL15 and 15 LSB current source cells LCELL1–LCELL15. Each of the MSB current source cells MCELL1–MCELL15 is connected through one of the 15 switches MS1–MS15 to output summing node OUT. Similarly, each of the LSB current source cells LCELL1–LCELL15 is connected through one of the 15 switches LS1–LS15 to output summing node OUT. The outputs MOUT1–MOUT15 of 4 to 15 converter 30 control operation of the switches MS1–MS15. Similarly, the outputs LOUT1–LOUT15 of 4 to 15 converter 32 control operation of the switches LS1–LS15. The switches can be controlled such that they are closed and conduct current when they receive a logical 1.

During operation, 8-bit digital input code IN1–IN8 is received by the 4 to 15 converters. The 4 to 15 converters 30 and 32 convert the digital input code to outputs MOUT1–MOUT15 and LOUT1–LOUT15. Those outputs MOUT1–MOUT15 and LOUT1–LOUT15 control operation of the switches MS1–MS15 and LS1–LS15, respectively. The closed switches conduct currents from the MSB current source cells MCELL1–MCELL15 and the LSB current source cells LCELL1–LCELL15 and the currents are summed at node OUT. The output current (sum) can be provided to a buffer stage (not shown) for providing a low-impedance analog output and/or gain. As will be understood by those skilled in the art, because the thermometer code controls operation of the switches, when the input code increases or decreases by binary 1, only one of the switches MS1–MS15 and LS1–LS15 changes state, reducing the transient glitch error problem associated with binary-weighted DACS.

Each LSB current source cell LCELLn of the DAC can be implemented using CMOS technology. For example, the LSB cell can be realized with a PMOS transistor as shown in FIG. 3. As shown, the transistor has a gate, a source and a drain. The gate of the transistor is connected to node BIAS for receiving a bias voltage. The source is connected to node SUPPLY for receiving a supply voltage. When the bias voltage is large enough to turn on the transistor, the supply voltage produces a current which flows from the source to the drain. The transistor acts as a current source.

For simplicity and purposes of illustration, the CMOS current source cell will be shown, as illustrated in FIG. 4, as a block with a dot representing the drain of the transistor.

As will be understood by those skilled in the art, the MSB current source cells are typically larger (produce more current) than the LSB current source cells. For example, in the prior art DAC shown in FIG. 2, each of the MSB current source cells MCELL1–MCELL15 can be 16 times larger than each of the LSB current source cells, LCELL1–LCELL15. To implement each MSB current source cell, 16 LSB current source cells are added together. If each LSB current source cell includes one CMOS transistor, then each MSB current source cell includes 16 CMOS transistors (of the same value) connected in parallel (e.g., with the drains electrically tied together).

FIG. 5 schematically represents the electrical connections of the transistors and also is diagrammatic of the physical layout of the transistors. FIG. 5 shows a prior art layout for the transistors used to implement the MSB current source cells MCELL1–MCELL15 and the LSB current source cells LCELL1–LCELL15 of the DAC of FIG. 2. As shown, the layout includes an array of 240 transistors, desirably of equal value, each labeled T. The array includes 15 columns and 16 rows of transistors. Each transistor shown is labeled as $T_{i,j}$ where i and j represent the column and row, respectively, of the transistor. Only the transistors of columns 1, 2, 14 and 15 are shown for ease in illustration.

As shown, each LSB current source cell LCELL1–LCELL15 includes one transistor. In this prior art example, the current source cells LCELL1-LCELL15 include 15 of the 16 transistors $T_{1,15}$–$T_{15,15}$ of column 15 of the array. A line drawn from the dot representing the drain of each transistor illustrates from where the current flows in each LSB cell.

Each MSB cell MCELL1–MCELL15 includes 16 transistors connected in parallel. Those connections are shown by a line connecting the dots representing the drains of the sixteen transistors. In this prior art example, MSB cell MCELL1 includes the parallel connection of the sixteen transistors $T_{1,1}$–$T_{16,1}$ of column 1. Similarly, MSB cell MCELL2 includes the parallel connection of the sixteen transistors $T_{1,2}$–$T_{16,2}$ of the transistors of column 2. Thus, as can be seen, each of the MSB cells MCELL1–MCELL15 includes the parallel connection of the sixteen transistors of the corresponding column of transistors in the array.

Ideally, the DAC should produce an analog output signal which linearly increases as the digital input code increases. However, as will be readily appreciated by those skilled in the art, the analog output signal of most DACs tends to be non-linear. DNL error is the deviation in the difference between two adjacent points in the transfer function (a graph of the analog output signal versus the digital input code) of the output voltage signal level from its ideal level. DNL errors in a DAC can effect the accuracy of the DAC and, if severe enough, can cause the DAC to be non-monotonic (one or more values of the analog output may actually be less than the values corresponding to smaller input codes).

DNL errors in such prior art DACs can be caused by gradients in the transistor values of the transistors within the array. The gradients are typically caused by process inaccuracies (i.e., fabrication inaccuracies such as faulty oxide irregularities, poor polysilicon etching or implant non-uniformities). Such process gradients can cause desirably identical transistors to pass different amounts of current. While current source DACs typically include a large number of transistors which ideally have the same value, (i.e., are of the same size and therefore pass the same amount of current), process gradients result in such transistors having different values. Although the adding of smaller current sources together (the MSB current sources include a number of LSB current sources added together) statistically increases the accuracy of the larger current sources, gradients across the array layout can cause DNL errors which negatively affect the accuracy and performance of the DAC. The gradients can be linear, non-linear or random.

In the prior art layout of FIG. 5, if a transistor process gradient (whether linear or non-linear) existed across the array from left to right, then the transistors of column 1 would have a very different value than the transistors of column 15. Therefore, MSB current source cell MCELL1 would generate a different amount of current than current source cell MCELL15. Additionally, MSB current source cell MCELL1 would not be equal to 16 times any of the LSB current source cells LCELL1–LCELL15 as desired. If the gradient is large enough, the resulting DNL error could cause inaccurate performance for the DAC.

Those skilled in the art will understand that a vertical gradient occurring across the array of the prior art layout of FIG. 5 would not cause DNL errors due to the arrangement. However, as will be appreciated by those skilled in the art, other prior art layouts (not shown) include the LSB current source cells arranged at any one of the top, bottom or either side of the array. Also, other prior art layouts include the MSB current source cells being alternatively added horizontally along the rows, instead of the columns as shown. In each of the prior art arrangements, a transistor gradient in one direction across the array could cause DNL errors.

Accordingly, a general object of the present invention is to provide a current source DAC having reduced DNL errors due to transistor process gradients.

Other objects and advantages will be apparent from the detailed description below.

SUMMARY OF THE INVENTION

A current source device according to the present invention includes an array of current source cells, wherein the LSB current source cells are physically arranged. centrally with respect to the MSB current source cells.

More particularly, in accordance with the present invention, a current source device includes a plurality of current source cells arranged in an array of plurality of columns and rows. The device includes a plurality of LSB current source cells, each LSB cell including at least one current source cell, and wherein the plurality of LSB cells includes current source cells from among a centrally located column of the array. The device also includes a plurality of MSB current source cells, wherein each MSB cell includes a plurality of current source cells electrically added, together and physically located along a diagonal path across the columns and rows of the array.

In accordance with the preferred embodiment of the present invention, the device includes a DAC and each LSB cell consists of one current source cell.

DETAILED DESCRIPTION

By contrast with prior art current source arrays in which the LSB current source cells are located at one of the top, bottom or sides of the array, the LSB cells of the array of the present invention are substantially centrally located within the array. Additionally, the MSB cells include cells electrically added together and physically located along a diagonal path across the columns and rows of the array.

Figure 5:
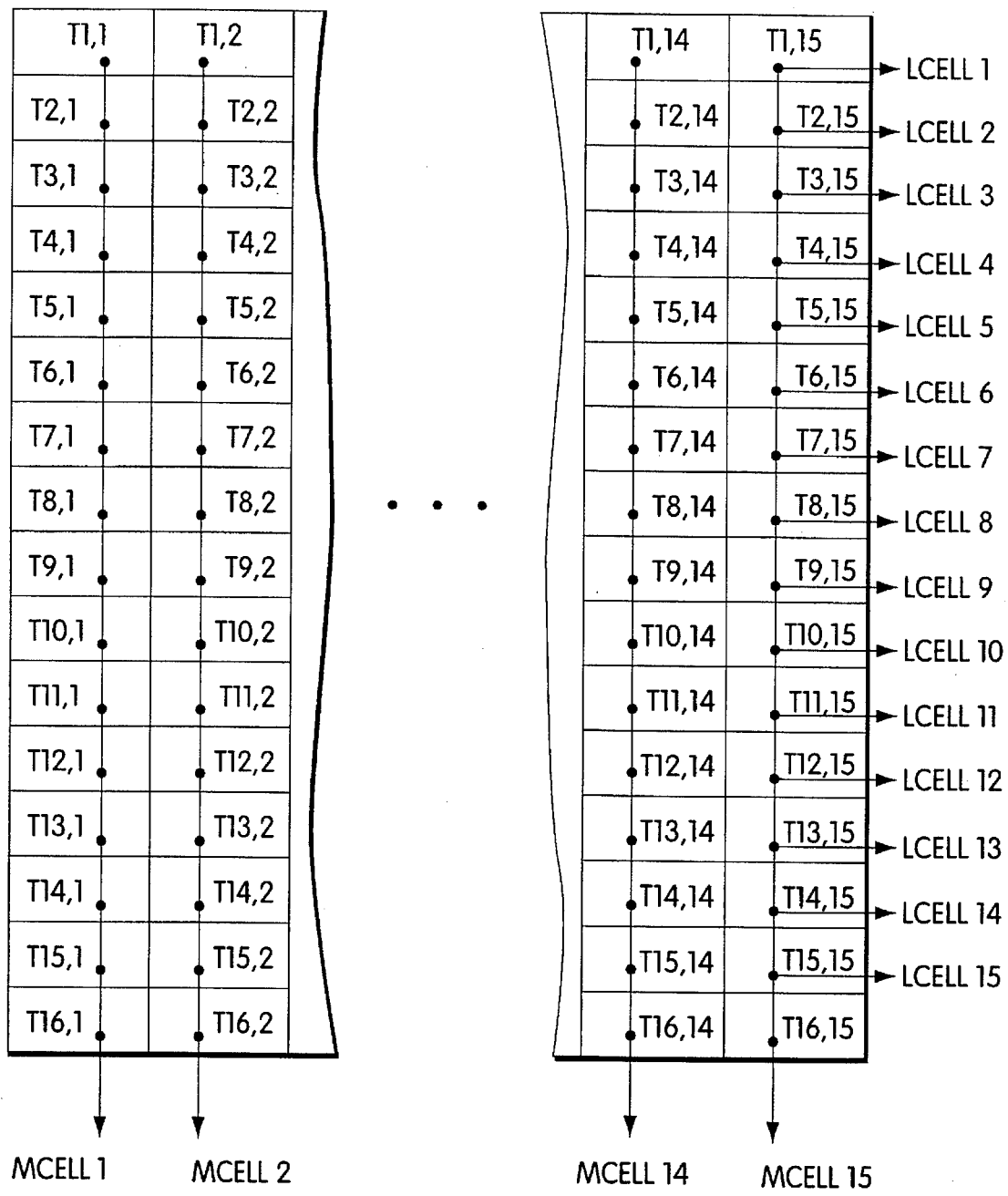
FIG. 5 is a block diagram of a prior art current source cell array.
Figure 6:
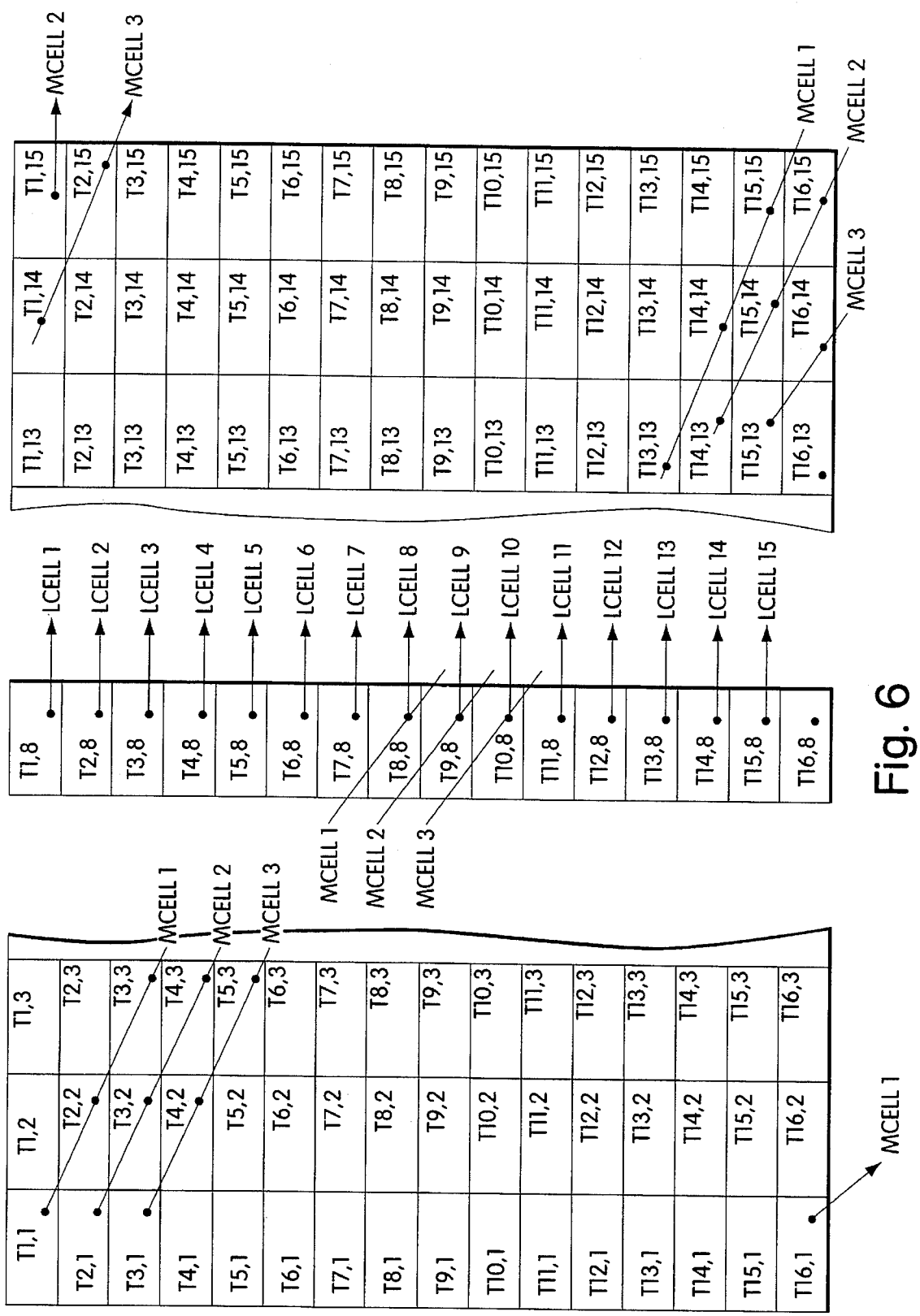
FIG. 6 is a block diagram of the current source .cell array according to the present invention.

FIG. 6 is a block diagram of the array of current source cells of the present invention. FIG. 6 schematically represents the connections of transistors and also is diagrammatic of the physical layout of the transistors. The array of transistors is shown similarly to that of FIG. 5 including 15 columns and 16 rows of transistors. Only columns 1, 2, 3, 8, 13, 14 and 15 are shown for ease in illustration.

Figure 1:
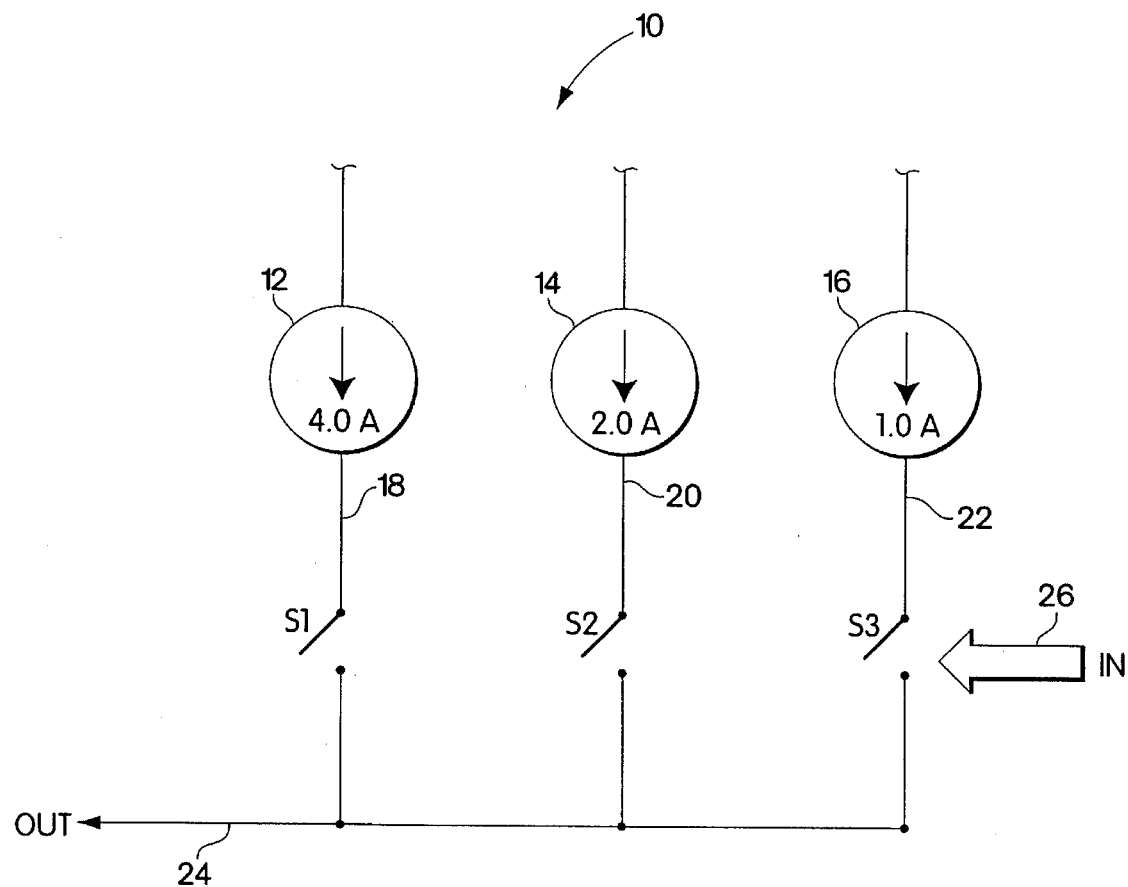
FIG. 1 is a block diagram of a prior art binary-weighted DAC.
Figure 2:
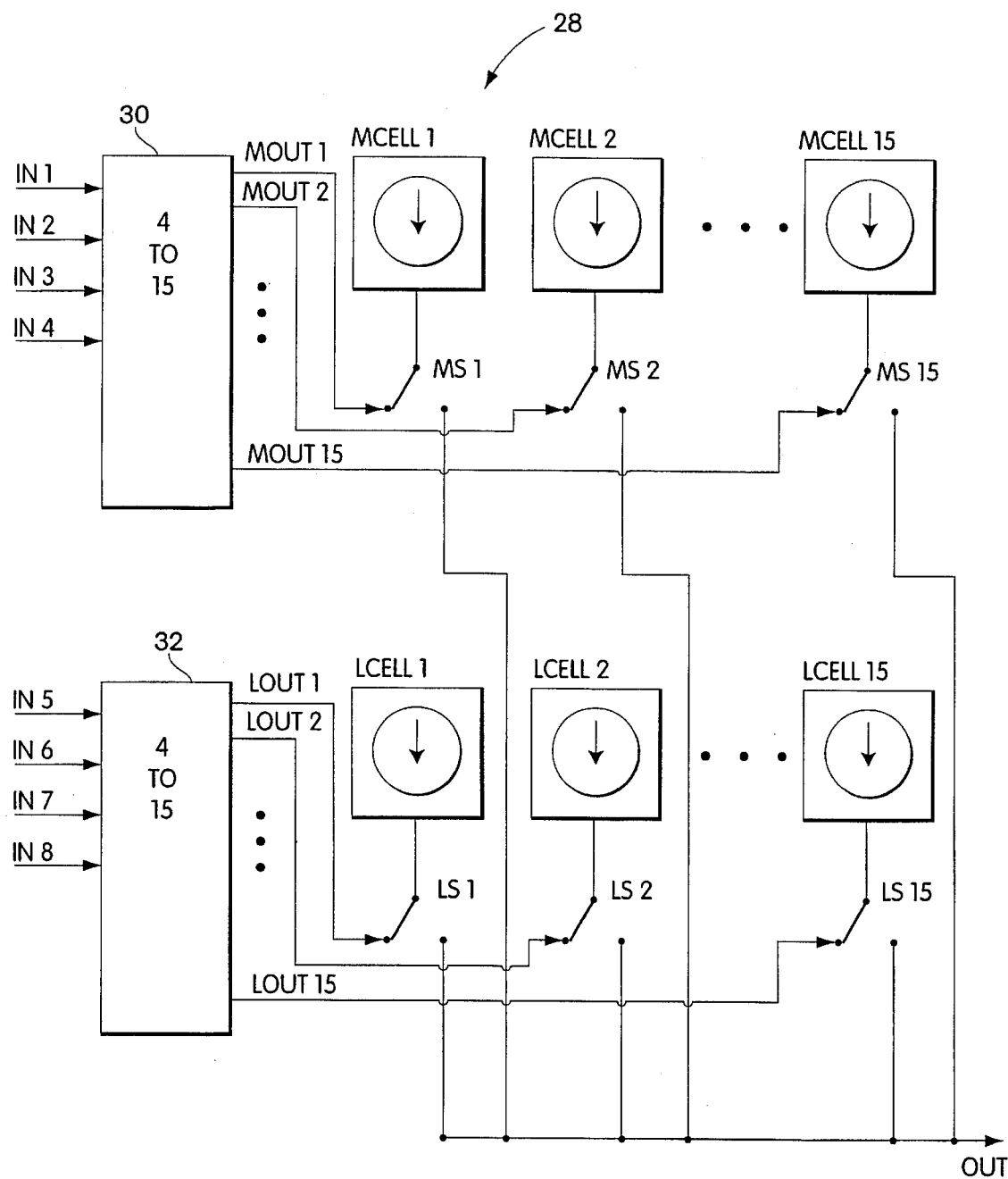
FIG. 2 is a partial block diagram of a prior art current source DAC.
Figure 3:
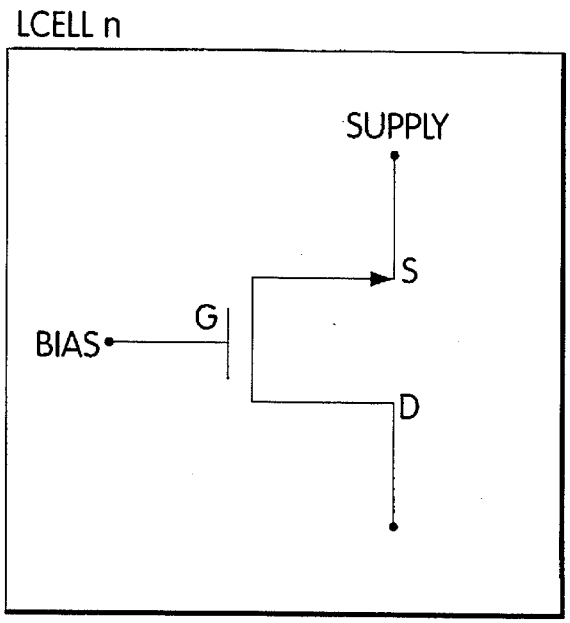
FIG. 3 is a schematic diagram of a prior art LSB current source cell.
Figure 4:
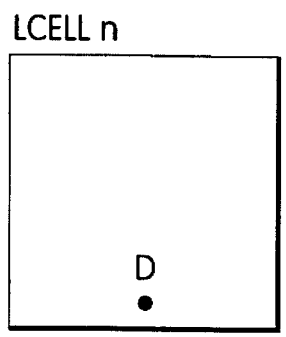
FIG. 4 is an illustrative block diagram of a prior art LSB current source cell.

In the current source array layout of the present invention, 15 LSB current source cells LCELL1–LCELL15 and 15 MSB current source cells MCELL1–MCELL15 are produced. Such current source cells can form the current source DAC shown in block diagram form in FIG. 2. Each of the MSB current source cells MCELL1–MCELL15 is preferably 16 times greater than each of the LSB current sources cell LCELL1–LCELL15. The number and size of the current source cells, however, is selected to be exemplary as the general physical layout and electrical connection scheme of the present invention can be used with different numbers of current source cells and those having different values and different ratios of values.

As shown in FIG. 6, the 15 LSB current source cells LCELL1–LCELL15 consist of the 15 transistors $T_{1,8}$–$T_{15,8}$ of the eighth column of the array. The eighth column is centrally located between the left side and the right side of the array.

Each of the MSB current source cells MCELL1–MCELL15, in this example including sixteen transistors connected in parallel (added), includes transistors electrically connected and physically located along a diagonal path across columns and rows of the array. Particularly, MSB current source cell MCELL1 includes transistors $T_{1,1}$, $T_{2,2}$, $T_{3,3}$, ... $T_{13,13}$, $T_{14,14}$, $T_{15,15}$ and $T_{16,1}$. MSB cell MCELL2 includes transistors $T_{2,1}$, $T_{3,2}$, $T_{4,3}$, ... $T_{14,13}$, $T_{15,14}$, $T_{16,15}$ and $T_{1,15}$. MSB cell MCELL 3 includes transistors $T_{3,1}$, $T_{4,2}$, $T_{5,3}$, ... $T_{16,14}$, $T_{1,14}$ and $T_{2,15}$. MSB cell MCELL4 includes transistors $T_{4,1}$, $T_{5,2}$... $T_{16,13}$, $T_{1,13}$, $T_{2,14}$, $T_{3,15}$. MSB cell MCELL5 includes transistors $T_{5,1}$, $T_{6,2}$ ... $T_{16,12}$, $T_{1,12}$, $T_{2,13}$, $T_{3,4}$ and $T_{4,14}$. The transistors making up the MSB cells MCELL6–MCELL15 continue systematically as listed above and should be readily determined by those skilled in the art. Only the lines connecting the drains of the transistors of the MSB cells MCELL1–MCELL3 are shown for ease of illustration.

By physically arranging the LSB cells centrally within the array of transistors and electrically adding transistors located diagonally across the columns and rows of the array to make up the MSB cells, DNL errors caused by transistor fabrication gradients are significantly reduced. Regardless of the direction of the gradient, the LSB cells are minimally affected due to their central location. Additionally, the effect on the MSB cells is greatly reduced due to their diagonal connection scheme.

While there have been shown and described what are at present considered the preferred embodiments of the present invention, which have been disclosed by way of example only, it should be obvious to those skilled in the art that various changes and modifications can be made therein without departing from the spirit and scope of the invention as presented above and as defined by the appended claims and equivalents thereto. For example, while the array of transistors included LSB current source cells located along a central column of the array, the LSB current source cells could alternatively be located along a central row of the array. Similarly, while the transistors making up each MSB current source cell were added along a diagonal path running from left to right and top to bottom, that diagonal path could alternatively run in a different diagonal direction. Further, while the array of current source cells was shown and described for use in a current source DAC, the arrangement of current source cells to reduce DNL errors could be used with any device (i.e., other than a DAC) requiring a plurality of current sources.

What is claimed is:

1. A current source device comprising:

a plurality of current source cells arranged in an array of a plurality of columns and rows;

a plurality of least significant bit cells, each least significant bit cell including at least one current source cell, the plurality of least significant bit cells including current source cells from among a centrally located column or row of the array; and a plurality of most significant bit cells, each most significant bit cell including a plurality of current source cells electrically added together and physically located along a diagonal path across the columns and rows of the array.

2. A device as claimed in claim 1 wherein each LSB cell consists of a current source cell.

3. A device as claimed in claim 1 wherein each current source cell includes a MOS transistor.

4. A device as claimed in claim 1 wherein the current source device is part of a DAC.

5. A current source device comprising:

a plurality of small current source cells arranged in an array of a plurality of columns and rows; and a plurality of large current source cells, each large current source cell including a plurality of small current source cells electrically added together and physically located along a diagonal path across the columns and rows of the array.

\* \* \* \* \*